United States Patent
Benaben et al.

(10) Patent No.: US 11,874,315 B2
(45) Date of Patent: Jan. 16, 2024

(54) METHOD FOR TESTING OUTPUTS OF AN ELECTRONIC DRIVER

(71) Applicant: Vitesco Technologies GmbH, Regensburg (DE)

(72) Inventors: Cédric Benaben, Toulouse (FR); Sébastien Raget, Toulouse (FR)

(73) Assignee: Vitesco Technologies GmbH

( * ) Notice: Subject to any disclaimer, the term of this patent is extended or adjusted under 35 U.S.C. 154(b) by 267 days.

(21) Appl. No.: 17/605,093

(22) PCT Filed: May 18, 2020

(86) PCT No.: PCT/EP2020/063768
§ 371 (c)(1),
(2) Date: Oct. 20, 2021

(87) PCT Pub. No.: WO2020/234217
PCT Pub. Date: Nov. 26, 2020

(65) Prior Publication Data
US 2022/0187356 A1    Jun. 16, 2022

(30) Foreign Application Priority Data
May 22, 2019  (FR) ...................................... 1905356

(51) Int. Cl.
*G01R 31/52* (2020.01)
*G01R 31/00* (2006.01)

(52) U.S. Cl.
CPC ........... *G01R 31/007* (2013.01); *G01R 31/52* (2020.01)

(58) Field of Classification Search
CPC ...... G01R 31/007; G01R 31/52; G01R 33/00; G01R 33/0035; G01R 33/0023;
(Continued)

(56) References Cited

U.S. PATENT DOCUMENTS

| 4,932,246 A * | 6/1990 | Deutsch | ............. | G01R 31/2829 |
| | | | | 73/114.45 |
| 6,330,140 B1 * | 12/2001 | Wilson-Jones | ........ | G01R 31/42 |
| | | | | 361/87 |

FOREIGN PATENT DOCUMENTS

WO    9732220 A1    9/1997

OTHER PUBLICATIONS

International Search Report and Written Opinion for International Application No. PCT/EP2020/063768, dated Aug. 20, 2020, with partial English translation, 9 pages.
(Continued)

*Primary Examiner* — Jermele M Hollington
*Assistant Examiner* — Taqi R Nasir
(74) *Attorney, Agent, or Firm* — RatnerPrestia

(57) ABSTRACT

A method for testing a device for monitoring an item of equipment of a motor vehicle. The method includes controlling a driver with a microcontroller in order that the driver performs at least one diagnosis, detecting an electrical fault of the monitoring device, positioning a switch connecting the driver and the circuit board in its open position, controlling the driver with the microcontroller in order that the driver reiterates the at least one diagnosis, and, in the event of the electrical fault being detected again, locating the electrical fault on the driver or, in the event of absence of detection of the electrical fault, locating the electrical fault outside the driver and in particular on the circuit board or between the driver and the circuit board.

11 Claims, 2 Drawing Sheets

(58) Field of Classification Search
CPC ............ G01R 33/0017; G01R 31/3191; G01B 7/004; G01C 17/38; G06F 3/017; G06F 3/0346; G06F 3/012
See application file for complete search history.

(56) References Cited

OTHER PUBLICATIONS

International Search Report and Written Opinion for International Application No. PCT/EP2020/063768, dated Aug. 20, 2020, 14 pages (French).

\* cited by examiner

METHOD FOR TESTING OUTPUTS OF AN ELECTRONIC DRIVER

CROSS REFERENCE TO RELATED APPLICATIONS

This application is the U.S. National Phase Application of PCT International Application No. PCT/EP2020/063768, filed May 18, 2020, which claims priority to French Patent Application No. 1905356, filed May 22, 2019, the contents of such applications being incorporated by reference herein.

FIELD OF THE INVENTION

The present invention relates to the testing of a monitoring device and more precisely to a method for testing the output electrical connectors of an electronic driver for an item of equipment of a motor vehicle and to such a monitoring device.

BACKGROUND OF THE INVENTION

In a motor vehicle with a combustion engine, it is known practice to drive certain items of equipment, such as, for example, the fuel injectors, using an electronic driver, which is connected to a circuit board by soldering.

To test that the driver is functioning correctly, it may be necessary to unsolder the driver from the circuit board and install it on a test bench in order to test in particular its output electrical connectors ("outputs") using a diagnostic tool.

However, it has been observed that certain faults only occur when the driver is soldered to the circuit board and used with a specific electrical load which is not necessarily identically reproducible on the test bench, which presents substantial drawbacks.

SUMMARY OF THE INVENTION

An aspect of the invention aims to at least partly overcome these drawbacks by providing a straightforward and effective solution that makes it possible to detect faults in a driver connected to an electrical load not reproducible on a test bench and in particular makes it possible to locate a fault on the driver or on the circuit board when the circuit board is connected to a specific electrical load.

To that end, a first aspect of the invention is a method for testing a device for monitoring an item of equipment of a motor vehicle, said monitoring device comprising an electronic driver, a microcontroller, able to control said driver, and a circuit board to which the driver is connected, said circuit board being furthermore electrically connected to an electrical load so that the driver can drive said electrical load, in particular in terms of voltage or current, said method being noteworthy in that, the monitoring device further comprising a switch, in particular a two-position switch, connected between the driver and the circuit board and configured to switch between a closed position, in which the driver and the circuit board are electrically connected, and an open position, in which the driver and the circuit board are electrically disconnected, it comprises the steps of:

the switch being in the closed position, controlling of the driver by the microcontroller so that said driver performs at least one diagnosis for detecting an electrical fault on the monitoring device, detection of an electrical fault of the monitoring device, positioning of the switch in its open position, controlling of the driver by the microcontroller so that said driver reiterates the at least one diagnosis, in the event of the electrical fault being detected again, locating of said electrical fault on the driver, in the event of absence of detection of the electrical fault, locating of said electrical fault outside the driver, in particular on the circuit board or between the driver and the circuit board, for example at a solder joint between the driver and the circuit board or else a foreign body or speck of dust on the circuit board or between the driver and the circuit board.

The method according to an aspect of the invention therefore makes it possible to detect with certainty whether an electrical fault has occurred on the driver or outside the driver, for example on the circuit board or at the solder joints between the driver and the circuit board or around the circuit board (for example due to a foreign body or speck of dust, etc.) in order to repair or replace the faulty element. This device makes it possible in particular to locate a fault before the operation of unsoldering the driver and the circuit board. Thus, if the fault is not located on the driver and the circuit board works perfectly with a new driver, fault searches can be directed toward problems linked to the production process (soldering, contamination, etc.).

Preferably, the method further comprises detection of the nature of the detected electrical fault, in particular if it is a short circuit, an open circuit, an overcurrent, etc.

According to one aspect of the invention, the electrical fault is detected by the microcontroller or by the driver.

An aspect of the invention also relates to a device for monitoring an item of equipment of a motor vehicle, said monitoring device comprising an electronic driver, a microcontroller, able to control said driver, and a circuit board to which the driver is connected, said circuit board being able to be electrically connected to an electrical load so that the driver can monitor said electrical load, in particular in terms of voltage or current, said monitoring device being noteworthy in that it further comprises a switch, in particular a two-position switch, configured to switch between a closed position, in which the driver and the circuit board are electrically connected, and an open position, in which the driver and the circuit board are electrically disconnected, and in that the microcontroller is configured to:

control the switch so as to be in its open position or in its closed position, control the driver so that said driver performs at least one diagnosis for detecting an electrical fault in the open position and in the closed position of the switch, detect an electrical fault of the monitoring device following at least one diagnosis for detecting an electrical fault performed by the driver, locate an electrical fault on the driver when said electrical fault has been detected in the closed position and in the open position of the switch, locate an electrical fault off the driver, in particular on the circuit board or between the driver and the circuit board when said electrical fault has been detected in the closed position but has not been detected in the open position of the switch.

Preferably, the driver comprises the switch in order to save space on the circuit board.

As a variant, the circuit board comprises the switch in order to be able to use an existing driver without a switch.

In one embodiment, the switch is a MOSFET-type transistor, this type of transistor making it possible to receive a large current which is necessary in certain applications.

As a variant, the switch is a bipolar-type transistor, this type of transistor being compact and inexpensive.

In one embodiment, the microcontroller is configured to determine the nature of the electrical fault detected according to the at least one diagnosis. In this case, the microcontroller can then decode the fault, for example a diagnostic frame provided by the driver, in order to allow an operator to analyze it.

In another embodiment, the driver comprises a control interface configured to determine the nature of the detected electrical fault according to the at least one diagnosis, thereby providing an integrated solution in which the driver is able to interpret detected faults itself.

In one embodiment, the microcontroller is mounted on the circuit board. In this case, the circuit board is standalone in order to perform complete fault diagnosis and there is no need to add additional diagnostic equipment.

In another embodiment, the microcontroller is mounted off the circuit board. Such a configuration makes it possible to use the solution with existing circuit boards without a microcontroller.

An aspect of the invention also relates to an electronic system comprising a monitoring device as presented above and an electrical load, which is electrically connected to the circuit board of the monitoring device so as to be able to be monitored by the driver of the monitoring device.

An aspect of the invention also relates to a vehicle, in particular a motor vehicle, comprising at least one item of equipment and at least one monitoring device, as presented above, which is able to monitor said at least one item of equipment.

DESCRIPTION OF THE DRAWINGS

Further features and advantages of aspects of the invention will become more clearly apparent from reading the following description. This description is purely illustrative and must be read with reference to the accompanying drawings, in which.

DESCRIPTION OF THE EMBODIMENTS

Figure 1:
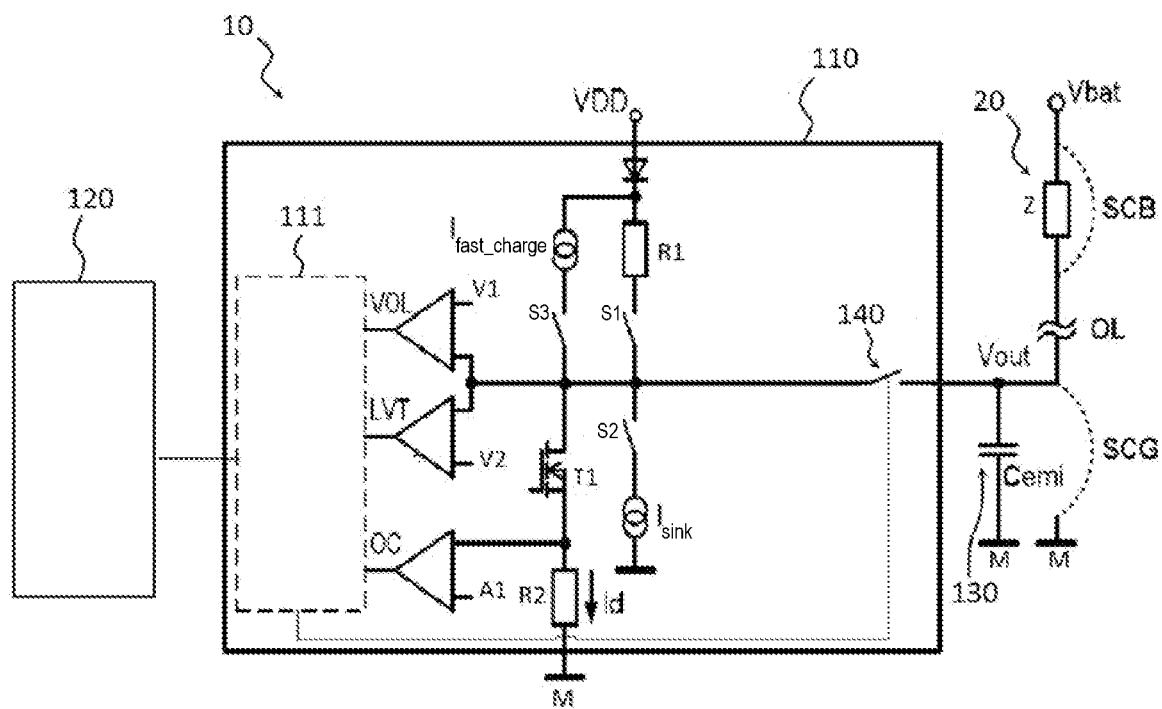
FIG. 1 schematically illustrates an electrical circuit modeling one embodiment of a monitoring device according to the invention, FIG. 2 schematically illustrates one embodiment of the method according to the invention.

FIG. 1 shows one embodiment of a monitoring device 10 according to the invention. The monitoring device 10 is intended to monitor an item of equipment of a motor vehicle. Such an item of equipment is represented or simulated by an "electrical load" 20 and is, for example, a relay or a plurality of relays, a fuel injector or a plurality of fuel injectors, an actuator or a plurality of actuators, an electric motor, etc.

The electrical load 20 may consist of one or more real items of equipment or else be simulated using electronic components such as, in particular, resistors, induction coils and capacitors. The electrical load 20 is notably represented in FIG. 1 by an impedance Z connected between the power supply battery of the vehicle (potential Vbat) and the output of the driver 110 (potential point Vout).

The monitoring device 10 comprises an electronic driver 110, a microcontroller 120, a circuit board 130, to which the driver 110 is connected and which is electrically connected to the electrical load 20, and what is referred to as a "diagnostic" switch 140. The circuit board 130 is modeled in FIG. 1 by a capacitor Cemi connected between the output of the driver 110 (potential point Vout) and a ground M.

The diagnostic switch 140 is a two-position switch, for example a MOSFET or bipolar transistor, which is configured to switch between a closed position, in which the driver 110 and the circuit board 130 are electrically connected, and an open position, in which the driver 110 and the circuit board 130 are electrically disconnected.

The microcontroller 120 is configured to control the switching of the switch 140 to its open position or to its closed position and to control the driver 110 so that said driver 110 performs one or more diagnoses for detecting faults in the monitoring device 10.

The role of the driver 110 is to control or drive the electrical load 20 according to the control commands received from the microcontroller 120 via a control interface 111, for example by allowing a current to flow from a battery or from a converter (not shown) to the electrical load 20 in order to supply it with power. By way of example, in the case where the electrical load 20 is or simulates a fuel injector and it is necessary to control said injector so as to open so that it injects fuel into an engine cylinder, the microcontroller 120 sends an open command to the driver 110 which then allows the flow of current to the injector in order to control it so as to open.

The role of the driver 110 is also to perform diagnoses for detecting faults according to the diagnostic commands received from the microcontroller 120 via the control interface 111. To that end, in the non-limiting example of FIG. 1, the driver 110 comprises, in addition to the control interface 111, a plurality of switches S1, S2, S3 with two positions (open or closed), a transistor T1, three comparators VOL, LVT, OC, a first resistor R1, a second resistor R2, a first current generator $I_{fast\_charge}$ and a second current generator $I_{sink}$. It should be noted that the architecture of the driver 110 described in this example does not limit the scope of an aspect of the present invention and that, in another embodiment, the driver 110 could comprise a different number of components or even other components.

The microcontroller 120 is configured to control the switching of the switches S1, S2 and S3 in order to place them each in an open position or in a closed position so as to obtain different configurations of the electrical circuit of the driver 110 allowing different diagnoses to be performed.

The control interface 111 makes it possible to interpret the control and diagnostic commands received from the microcontroller 120. Preferably, the control interface 111 is of SPI type (for Serial Peripheral Interface). This control interface 111 makes it possible to receive and interpret the commands generated and sent by the microcontroller 120, via a synchronous data bus, and to receive the output values of the comparators VOL, LVT, OC in order to detect a fault on the monitoring device 10, as will be explained below.

The commands sent by the microcontroller 120 may, for example, take the form of series of bits which allow in particular the control interface 111 to position the diagnostic switch 140 and the switches S1, S2, S3 in the open or closed position in order to have different currents flow through the electrical circuit of the driver 110.

Thus, during a diagnosis and in the absence of an electrical fault in the monitoring device 10, the output values given by the comparators VOL, LVT, OC correspond to expected predetermined values. However, when an electrical fault, for example a short circuit, is present on the driver 110 or on the circuit board 130 or between the driver 110 and the circuit board 130, the presence and/or the intensity of certain currents flowing through the electrical circuit of the driver 110 is changed, which makes it possible to detect faults.

The first resistor R1 has the function of simulating a standard load that the monitoring device 10 is intended to monitor. The second resistor R2, passed through by a current denoted by Id, has the function of providing a voltage that is the image of the current which flows through the output and of allowing the detection of an overcurrent. The first current generator $I_{fast\_charge}$ has the function of participating in the detection of a short circuit to the supply voltage VDD which supplies the driver 110 with power. The second current generator $I_{sink}$ has the function of participating in the detection of a short circuit to ground M.

The electrical load 20 is connected to the circuit board 130 so as to be monitored by the driver 110. As mentioned above, the electrical load 20 may be an item of equipment equivalent to that to which the monitoring device 10 will have to be connected in the vehicle or else it may consist of resistors, induction coils and/or capacitors that make it possible to electrically simulate the item of equipment that the monitoring device 10 is intended to monitor in the vehicle.

In one embodiment, the microcontroller 120 is configured to receive the output values of the VOL, LVT, OC comparators and to detect one or more faults in the monitoring device following at least one diagnosis for detecting a fault performed by the driver 110 according to said output values. When it has detected a fault, the microcontroller 120 is configured to determine that the fault is present on the driver 110, that is to say to determine that the fault is on the driver 110, when said fault has been detected in the closed position and in the open position of the diagnostic switch 140, and to determine that a fault is present on the circuit board 130, that is to say to determine that the fault is on the circuit board 130, when said fault has been detected in the closed position but has not been detected in the open position of the diagnostic switch 140.

In another embodiment, the control interface 111 of the driver 110 may be configured to itself detect faults in the monitoring device 10 following a diagnosis or a series of diagnoses. More precisely, in this case, the control interface 111 is configured to determine that a fault is present on the driver 110 when said fault has been detected in the closed position and in the open position of the diagnostic switch 140 and to determine that a fault is present on the circuit board 130 when said fault has been detected only in the closed position of the diagnostic switch 140 (i.e. has not been detected in the open position of the diagnostic switch 140 for one and the same diagnosis).

Figure 2:
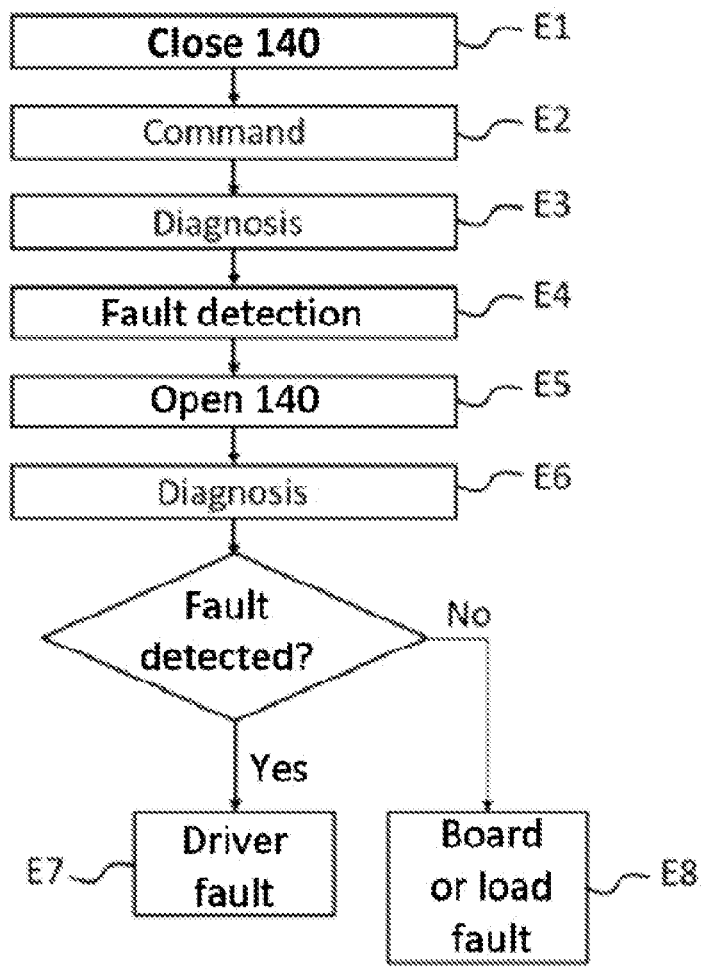

The method according to an aspect of the invention will now be described in terms of the implementation thereof with reference to FIGS. 1 and 2.

First, in a step E1, the microcontroller 120 ensures that the diagnostic switch 140 is closed or else controls the diagnostic switch 140 so that it switches to the closed position.

Once the switch is closed, the microcontroller 120 sends, in a step E2, one or more diagnostic commands to the driver 110, via the control interface 111, so that said driver 110 performs, in a step E3, one or more electrical fault detection diagnoses on the monitoring device 10, in particular in order to detect a short circuit SCG (FIG. 1) between the circuit board 130 and ground M or else a short circuit SCB across the terminals of the impedance Z representing the electrical load 20 (FIG. 1), or else an open circuit OL ("open load"), or an overcurrent.

By way of example, a series of diagnoses may consist in opening or closing the switches S1, S2, S3 in order to position them in different configurations and analyze, for each configuration, the output values of the comparators VOL, LVT, OC. Thus, the microcontroller 120 (or the control interface 111 of the driver 110) does not detect any electrical fault when the output values of the comparators VOL, LVT, OC correspond to expected values for the tested configurations or, conversely, detects an electrical fault when the output values of the comparators VOL, LVT, OC are different from the expected values for the tested configurations. In FIG. 1, the comparators VOL, LVT are connected over an input to a voltage reference V1, V2, respectively, which serves as a reference for comparison with the voltage values received by the comparators VOL, LVT over their other input in the different configurations of the switches S1, S2, S3. The comparator OC is connected over an input to a current reference A1 which serves as a reference for comparison with the currents received by the comparator OC over its other input in the different configurations of the switches S1, S2, S3.

When a fault has been detected (step E4), the microcontroller 120 controls the diagnostic switch 140 so as to place it in its open position, in a step E5, and thus electrically isolate the driver 110 from the circuit board 130.

Next, in a step E6, the microcontroller 120 controls the driver 110 so that said driver 110 reiterates the one or more same diagnoses as in step E3.

If the microcontroller 120 (or the control interface 111) detects the same fault as in step E4 again, then it deduces therefrom, in a step E7, that this electrical fault is a fault in the driver 110, that is to say is located on one of the components or one of the electrical connections of the driver 110.

If the microcontroller 120 (or the control interface 111) does not detect the same fault as in step E4 again, then it deduces therefrom, in a step E8, that this electrical fault is a fault in the circuit board 130, that is to say is located on one of the components or electrical connections of the electronic board 130, or the electrical load 20. For example, the fault may be a short circuit SCG connecting the circuit board 130 to ground M or a short circuit SCB across the terminals of the impedance Z representing the electrical load 20 (FIG. 1), or else an open circuit OL ("open load"), or an overcurrent.

The method according to an aspect of the invention thus makes it possible both to detect a fault without unsoldering the driver 110 from the circuit board 130 and to precisely locate said fault on the driver 110 or on the circuit board 130 or between the driver 110 and the circuit board 130 in order to be able to repair the faulty component as applicable.

The invention claimed is:

1. A method for testing a device for monitoring an item of equipment of a motor vehicle, said monitoring device comprising an electronic driver, a microcontroller, able to control said driver, and a circuit board to which the driver is connected, said circuit board being furthermore electrically connected to an electrical load so that the driver can drive said electrical load, the monitoring device further comprising a switch connected between the driver and the circuit board and configured to switch between a closed position, in which the driver and the circuit board are electrically connected, and an open position, in which the driver and the circuit board are electrically disconnected, the method comprising:

the switch being in the closed position, controlling of the driver by the microcontroller so that said driver performs at least one diagnosis for detecting an electrical fault on the monitoring device;

detection of an electrical fault of the monitoring device;

positioning of the switch in its open position;

controlling of the driver by the microcontroller so that said driver reiterates the at least one diagnosis;

in the event of the electrical fault being detected again, locating of said electrical fault on the driver; and in the event of absence of detection of the electrical fault, locating of said electrical fault on the circuit board or between the driver and the circuit board.

2. The method as claimed in claim 1, further comprising detection of the nature of the detected electrical fault.

3. The method as claimed in claim 1, wherein the electrical fault is detected by the microcontroller or by the driver.

4. The method as claimed in claim 2, wherein the electrical fault is detected by the microcontroller or by the driver.

5. A device for monitoring an item of equipment of a motor, vehicle, said monitoring device comprising an electronic driver, a microcontroller able to control said driver, and a circuit board to which the driver is connected, said circuit board being able to be electrically connected to an electrical load so that the driver can monitor said electrical load, said monitoring device, a switch configured to switch between a closed position, in which the driver and the circuit board are electrically connected, and an open position, in which the driver and the circuit board are electrically disconnected, the microcontroller is configured to:

control the switch so as to be in its open position or in its closed position;

control the driver so that said driver performs at least one diagnosis for detecting an electrical fault in the open position and in the closed position of the switch;

detect an electrical fault of the monitoring device following at least one diagnosis for detecting an electrical fault performed by the driver;

locate an electrical fault on the driver when said electrical fault has been detected in the closed position and in the open position of the switch; and locate an electrical fault on the circuit board or between the driver and the circuit board when said electrical fault has been detected in the closed position but has not been detected in the open position of the switch.

6. The monitoring device as claimed in claim 5, wherein the driver comprises the switch.

7. The monitoring device as claimed in claim 5, wherein the circuit board comprises the switch.

8. The monitoring device as claimed in claim 5, wherein the switch is a MOSFET-type transistor or a bipolar-type transistor.

9. The monitoring device as claimed in claim 5, wherein the microcontroller is configured to determine the nature of the electrical fault detected according to the at least one diagnosis.

10. An electronic system for a motor vehicle, said system comprising a monitoring device as claimed in claim 5 and an electrical load, which is electrically connected to the circuit board of the monitoring device so as to be able to be monitored by the driver of the monitoring device.

11. A motor vehicle comprising at least one item of equipment and at least one monitoring device as claimed in claim 5 able to monitor said at least one item of equipment.

* * * * *

UNITED STATES PATENT AND TRADEMARK OFFICE
CERTIFICATE OF CORRECTION

PATENT NO. : 11,874,315 B2
APPLICATION NO. : 17/605093
DATED : January 16, 2024
INVENTOR(S) : Cédric Benaben and Sébastien Raget Page 1 of 1

It is certified that error appears in the above-identified patent and that said Letters Patent is hereby corrected as shown below:

In the Claims

Column 7, Line 13, Claim 5: change "motor," to --motor--.

Column 7, Line 14, Claim 5: change "microcontroller" to --microcontroller,--.

Signed and Sealed this
Twenty-sixth Day of November, 2024

Katherine Kelly Vidal
*Director of the United States Patent and Trademark Office*